(12) United States Patent
Suzuki (10) Patent No.: US 8,222,590 B2
(45) Date of Patent: Jul. 17, 2012

(54) SIGNAL AMPLIFIER FOR OPTICAL RECEIVER CIRCUIT

(75) Inventor: Yasuyuki Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 480 days.

(21) Appl. No.: 12/529,888

(22) PCT Filed: Mar. 27, 2008

(86) PCT No.: PCT/JP2008/055858
§ 371 (c)(1),
(2), (4) Date: Sep. 3, 2009

(87) PCT Pub. No.: WO2008/120663
PCT Pub. Date: Oct. 9, 2008

(65) Prior Publication Data
US 2010/0116969 A1    May 13, 2010

(30) Foreign Application Priority Data

Mar. 29, 2007  (JP) .................................. 2007-088261

(51) Int. Cl.
*H03F 3/08* (2006.01)
(52) U.S. Cl. ...................... 250/214 A; 398/202; 330/59
(58) Field of Classification Search ............. 250/214 A, 250/214.1, 214 R; 398/202, 182–183; 330/59
See application file for complete search history.

(56) References Cited

U.S. PATENT DOCUMENTS

| | | | | |
|---|---|---|---|---|
| 5,191,298 A | * | 3/1993 | Funahashi et al. | 330/149 |
| 5,875,049 A | * | 2/1999 | Asano et al. | 398/202 |
| 6,603,110 B2 | * | 8/2003 | Hayami et al. | 250/214 R |
| 6,829,441 B2 | * | 12/2004 | Chujo et al. | 398/183 |

FOREIGN PATENT DOCUMENTS

| | | |
|---|---|---|
| JP | 9-205331 A | 8/1997 |
| JP | 9-233030 A | 9/1997 |
| JP | 2000031914 A | 1/2000 |
| JP | 2000269590 A | 9/2000 |
| JP | 2001320249 A | 11/2001 |
| JP | 2003051723 A | 2/2003 |
| JP | 2004131336 A | 4/2004 |
| JP | 2004336749 A | 11/2004 |

* cited by examiner

*Primary Examiner* — Seung C Sohn (57) ABSTRACT

A signal amplifier connected to a photodetector that converts a received optical signal to a current signal includes: a preamplifier converting the current signal to voltage and supplying the resultant voltage signal; a main amplifier amplifying the voltage signal supplied from the preamplifier and in which at least the input stage is made up from a differential circuit; two or more follower circuits provided between the preamplifier and the main amplifier and supplied with the voltage signal; resistors of equal resistance provided for each follower circuit on the paths between the output of the preamplifier and each input of the main amplifier; and a capacitor having one end connected to one of the resistors and the other end connected to ground. A low-pass filter for detecting the average potential of the voltage signal is configured by the capacitor and the resistor that is connected to the capacitor.

19 Claims, 8 Drawing Sheets

SIGNAL AMPLIFIER FOR OPTICAL RECEIVER CIRCUIT

This application is the National Phase of PCT/JP2008/055858, filed Mar. 27, 2008, which claims priority based on Japanese Patent Application No. 2007-88261, filed on Mar. 29, 2007, and the disclosures of which is incorporated herein in its entirety by reference.

TECHNICAL FIELD

The present invention relates to an optical receiver circuit used for receiving an optical signal in a high-speed optical communication system, and more particularly to a signal amplifier that is used in an optical receiver circuit and effects current-voltage conversion and amplification of a current signal from a photoelectric conversion element.

BACKGROUND ART

In recent years, a higher level of processing is being sought in the field of information signal processing, and with this trend, semiconductor integrated circuits that can process signals of a broader bandwidth have become necessary. In particular, transmission data rates have improved dramatically in optical communication systems, with optical transmission at transmission data rates of 2.4 gigabit/second (Gb/s) or 10 Gb/s having been put to practical use, and further, research and development progressing on systems having transmission data rates of 40 Gb/s or more. An optical receiver circuit is a circuit for converting an optical signal emitted from a transmission medium such as optical fiber to a current signal, and is made up from: a photodetector (i.e., a photoelectric conversion element) that converts an optical signal to a current signal, and a signal amplifier that converts the current signal from the photodetector to a voltage signal and then amplifies the voltage signal to the voltage required in circuits connected in subsequent stages.

Figure 1:
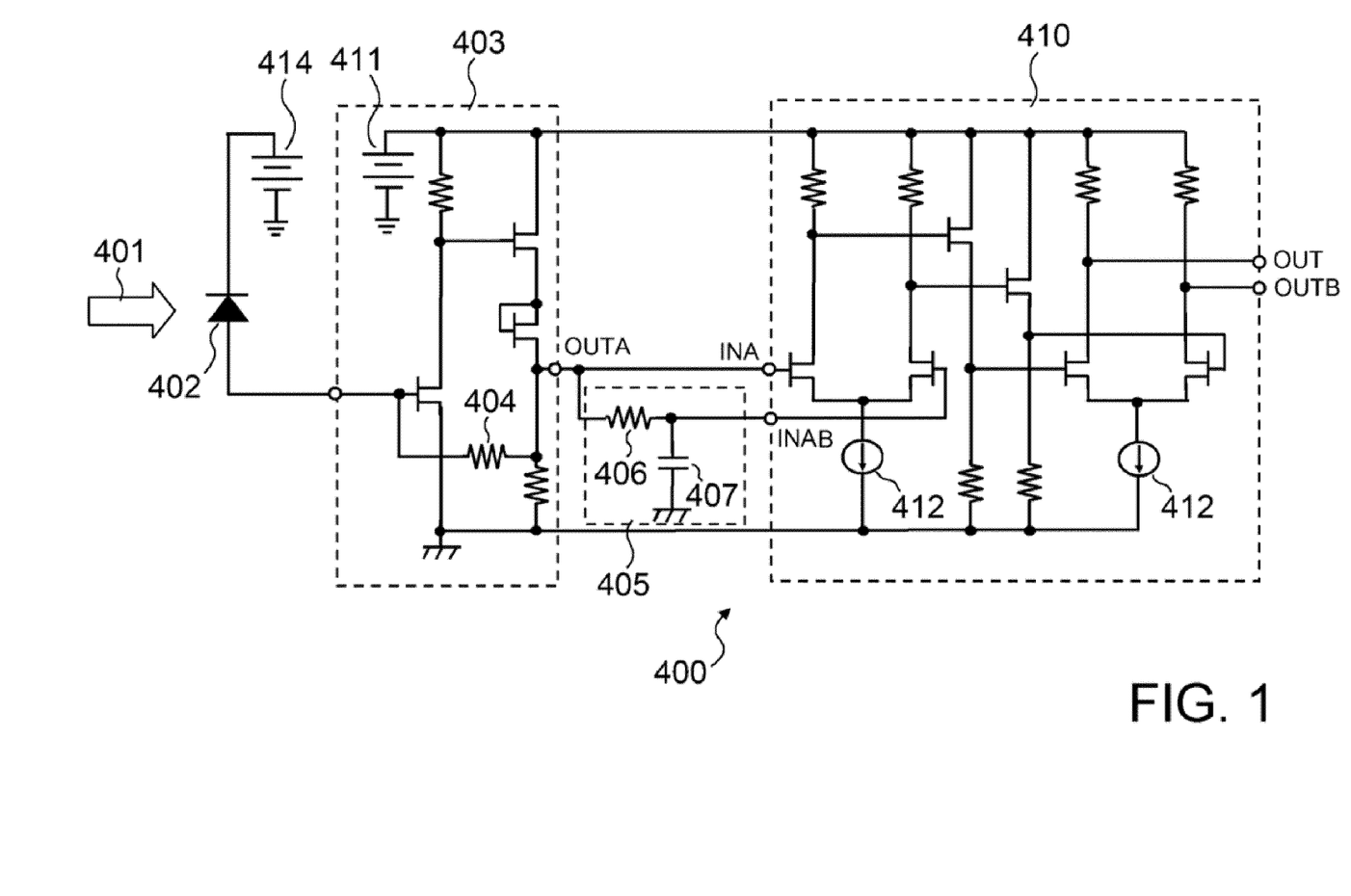
FIG. 1 is a circuit diagram showing an example of the configuration of an optical receiver circuit in a related art.

FIG. 1 shows an example of the circuit configuration of an optical receiver circuit in the related art. Optical receiver circuit 400 shown in FIG. 1 includes: photodetector 402 converting optical signal 401 emitted from an optical fiber or the like to a current signal; preamplifier 403 connected to the output of photodetector 402 and made up from a transimpedance amplifier having feedback resistor 404; low-pass filter (LPF) 405 made up of resistor 406 having a resistance of R and capacitor 407 having a capacitance of C; and main amplifier 410 made up of two stages of differential amplifier circuits that are connected in cascade connection. LPF 405 passes the low-frequency component of the output signal of preamplifier 403 and delivers the low frequency component as a low-frequency signal. The signal amplifier is made up from preamplifier 403, LPF 405 and main amplifier 410. Each of preamplifier 403 and main amplifier 410 is a circuit constructed using FETs (field-effect transistors) as the basic transistors. A basic transistor is a transistor that relates to the operation of amplifying an electric signal as an active element in the amplifier circuit.

A semiconductor photodetector such as a photodiode is used as photodetector 402. The cathode of photodetector 402 is connected to power supply 414 for photodetector use, and a reverse voltage is applied to this cathode. The anode of photodetector 402 is connected to the input terminal of preamplifier 403. Photodetector 402 receives optical signal 401 emitted from an optical fiber or the like, converts optical signal 401 to a current signal (photocurrent) that corresponds to the optical signal, and supplies this current signal as output.

In preamplifier 403, the current generated in photodetector 402 flows to feedback resistor 404, causing an electric potential difference across the two ends of feedback resistor 404, the output electric potential of preamplifier 403 changing in accordance with this difference. This operation of preamplifier 403 is referred to as "current-voltage conversion."

Main amplifier 410 amplifies the voltage signal that is the output of preamplifier 403. Output OUTA of preamplifier 403 is led to one input terminal (non-inverted input terminal) INA of the first-stage differential amplification circuit of main amplifier 410. This signal supplied to non-inverted input terminal INA is referred to as the main signal. The low-frequency signal that has passed through LPF 405 from the output of preamplifier 403 is applied to the other input terminal (inverted input terminal) INAB of the first-stage differential amplification circuit of main amplifier 410. The low-frequency signal from LPF 405 gives an instantaneous average value for the signal supplied from preamplifier 403 over a time width that is of an order no greater than time constant T realized by resistor 406 and capacitor 407. The time constant T is represented by T=CR.

Main amplifier 410 amplifies the difference between two signal inputs, i.e., the main signal (the signal to non-inverted input terminal INA) that corresponds to data superposed on the optical signal and the instantaneous average value of the main signal (the signal to inverted input terminal INAB) and generates a complementary pair of outputs OUT, OUTB. Accordingly, in this optical receiver circuit, the polarities of outputs OUT, OUTB change according to whether the instantaneous value of the optical signal is greater or smaller than the instantaneous average value obtained from LPF 405. Using these complementary outputs OUT, OUTB in this way enables the implementation of processing that accords with the optical signal. Common power supply 411 is provided for preamplifier 403 and main amplifier 410, and constant-current source circuit 412 is provided for each differential amplification circuit in main amplifier 410.

In LPF 405, resistor 406 is provided between output OUTA of preamplifier 403 and inverted input INAB of main amplifier 410, and one end of capacitor 407 is connected to the connection point of resistor 403 and inverted input INAB and the other end of the capacitor is grounded. The cutoff frequency $f_c$ of this type of LPF 405 is given by $$f_c = \frac{1}{2\pi RC}.$$

Accordingly, resistance R of resistor 406 and capacitance C of capacitor 407 are determined by the frequency of the lower-frequency side of the data signal that is to be processed in this optical receiver circuit.

Figure 2:
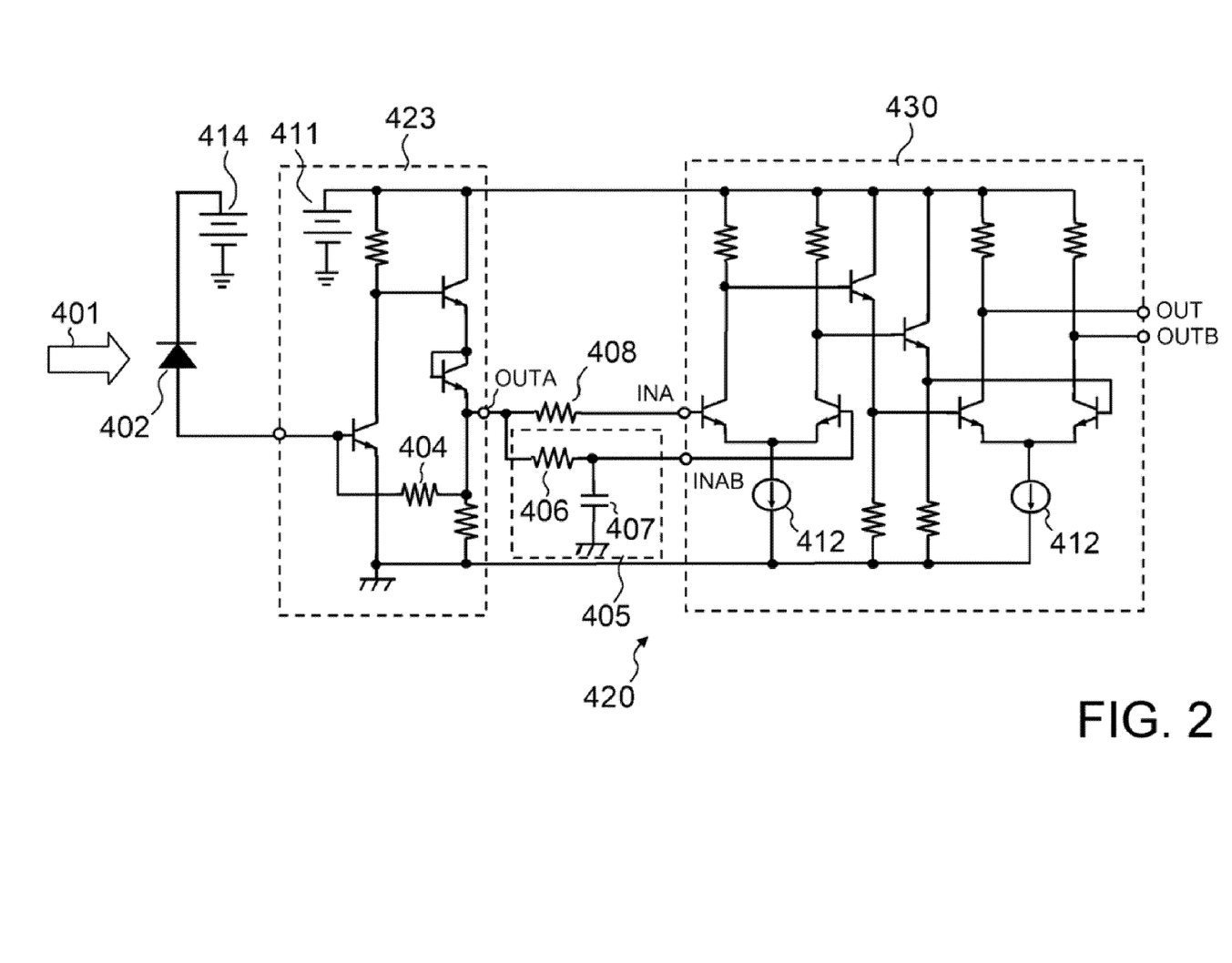
FIG. 2 is a circuit diagram showing another example of the configuration of an optical receiver circuit in the related art.

The optical receiver circuit shown in FIG. 1 is constructed by a signal amplifier that uses, as basic transistors, FETs in which current does not flow to the gate, but as shown in FIG. 2, an optical signal receiver circuit can also be constructed by a signal amplifier that uses bipolar transistors as basic transistors. Optical receiver circuit 420 shown in FIG. 2 is a circuit in which each FET in the signal amplifier of the optical receiver circuit shown in FIG. 1 is replaced with an NPN bipolar transistor. In other words, the circuit shown in FIG. 2 is a circuit provided with preamplifier 423 that uses bipolar transistors in place of preamplifier 403 shown in FIG. 1 and provided with main amplifier 430 that uses bipolar transistors in place of main amplifier 410 shown in FIG. 1. The signal amplifier is formed by preamplifier 423, LPF 405, and main amplifier 430.

In optical receiver circuit 420 including a signal amplifier that uses bipolar transistors as the basic transistors, despite the use of LPF 405 that is composed of resistor 406 and capacitor 407, the base current flowing to the bipolar transistors gives rise to a slight difference in the voltage level between the DC (direct current) level at non-inverted input terminal INA of the main signal and the instantaneous average value in the signal that is supplied from LPF 405 and applied to inverted input terminal INAB. In the case of receiver of a weak optical signal transmitted over a long distance, this voltage difference may obstruct the amplification of the signal. In other words, the receiver sensitivity may drop. As a method of solving this problem that arises from this difference, level-adjustment resistor 408 that has the same resistance as resistor 406 provided in LPF 405 is inserted between output OUTA of preamplifier 423 and non-inverted input INA of main amplifier 430 in the circuit shown in FIG. 2. However, when level-adjustment resistor 408 is inserted in the input path of the main signal to the differential circuit, the bandwidth of the signal amplifier for optical receiver circuit is narrowed as a whole, and in particular, gain drops on the higher-frequency side.

Figure 3:
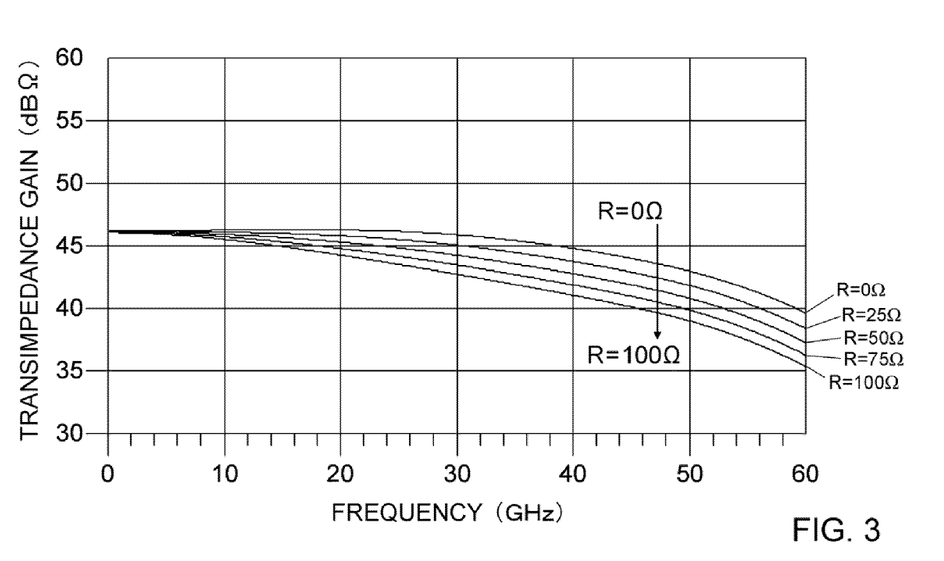
FIG. 3 is a graph showing a frequency characteristic of transimpedance gain of a signal amplifier in the optical receiver circuit shown in FIG. 2.

FIG. 3 shows the frequency characteristic of transimpedance gain for the signal amplifier as a whole when varying the value of level-adjustment resistor 408 of the signal amplifier, in optical receiver circuit 420 shown in FIG. 2. Here it can be seen that gain undergoes a large decrease on the higher-frequency side with increase in resistance R of level-adjustment resistor 408. As previously stated, the value of level-adjustment resistor 408, i.e., value R of resistor 406 of LPF 405, is determined by the frequency of the lower-frequency side of the data signal. For example, if the capacitance (for example 0.11 µF) that can be accommodated in a module that incorporates an optical receiver circuit is considered, when the cut-off frequency of the lower band is assumed to be 30 kHz, the necessary resistance R becomes 50Ω or more, but in a signal amplifier for an optical receiver circuit of the related art that includes level-adjustment resistor 408 of this magnitude, the transimpedance gain of the higher-frequency side in the signal amplifier falls precipitously.

Even in the case of a signal amplifier for an optical receiver circuit that uses bipolar transistors as the basic transistors, it is desirable to maintain high receiver sensitivity and high gain on the higher-frequency side.

As technology that relates to the present invention, JP-A-2000-031914 (Patent Literature 1) discloses an optical receiver circuit using an avalanche photodiode (APD) as a photodetector. In this optical receiver circuit, a component having a Bessel characteristic is used as an LPF provided between the preamplifier and main amplifier, and by detecting the output level of the main amplifier and varying the voltage applied to the APD in accordance with the detected level, fluctuation of the cut-off frequency and group delay is reduced over a broad dynamic range.

JP-A 2000-269590 (Patent Literature 2) relates to an optical transmission circuit and not to an optical receiver circuit, but discloses the provision of an emitter-follower circuit that receives a current signal corresponding to the optical signal to be transmitted and drives laser diode drive transistors by the output of this emitter-follower circuit.

JP-A-2003-051723 (Patent Literature 3) discloses an optical receiver circuit in which: a differential amplification circuit is used as a preamplifier directly connected to a photodetector; the first stage of a main amplifier is configured as an emitter-follower circuit and directly connects the output of the preamplifier with the input of the main amplifier; and further, an automatic offset-adjustment circuit including a low-pass filter is connected to the inverted input side of the preamplifier.

JP-A-H9-205331 (Patent Literature 4) discloses, in a differential amplification circuit in which a first differential amplification stage, a first emitter follower, a second differential amplification stage, and a second emitter follower are connected in that order in cascade connection, the insertion of a resistor between the first emitter follower and the second differential amplification stage.

JP-A-H9-233030 (Patent Literature 5) discloses the provision of an LPF between a preamplifier connected to a photo-detector and a main amplifier.

DISCLOSURE OF THE INVENTION

Problem to be Solved by the Invention

It is an object of the present invention to provide a signal amplifier: that is used in an optical receiver circuit, that includes a preamplifier and a main amplifier that is made up from differential amplification circuits, and in which an LPF is inserted between the preamplifier and the main amplifier and the difference between the instantaneous value of the optical signal and the instantaneous average value obtained from the LPF is amplified in the main amplifier; and further, that can reduce the influence of a level-adjustment resistor that is provided when the input impedance of the input stage of the main amplifier cannot be ignored, and that can obtain a wideband frequency characteristic and high optical receiver sensitivity.

Means for Solving the Problem

According to the first exemplary aspect of the present invention, a signal amplifier connected to a photodetector that converts a received optical signal to a current signal comprises: a preamplifier converting the current signal to voltage and supplying the resultant voltage signal; a main amplifier amplifying the voltage signal supplied from the preamplifier, wherein at least an input stage of the main amplifier is made up from a differential circuit; two or more follower circuits provided between the preamplifier and the main amplifier and supplied with the voltage signal; resistors having equal resistance provided for each follower circuit on paths between the output of the preamplifier and each input of the main amplifier; and a capacitor having one end connected to one of the resistors and the other end grounded. A low-pass filter detecting the average potential of the voltage signal is formed by the capacitor and the resistor connected to the capacitor.

According to the second exemplary aspect of the present invention, a signal amplifier connected to a photodetector that converts a received optical signal to a current signal comprises: a preamplifier converting the current signal to voltage and supplying the resultant voltage signal; a main amplifier amplifying the voltage signal supplied form the preamplifier, wherein at least an input stage of the main amplifier is made up from a differential circuit; first and second emitter-follower circuits; a first resistor having one end connected to the input of the first emitter-follower circuit; a second resistor having one end connected to the input of the second emitter-follower circuit and having the same resistance as the first resistor; and a capacitor inserted between the one end of the second resistor and a ground node. The other end of the first resistor and the other end of the second resistor are connected in common, and the output of the preamplifier is supplied to this common connection node. The outputs of the first and second emitter-follower circuits are each connected to a respective input of a pair of inputs of the differential circuit. A low-pass filter detecting the average potential of the voltage signal is formed by the capacitor and the second resistor.

According to the third exemplary embodiment of the present invention, a signal amplifier connected to a photodetector that converts a received optical signal to a current signal comprises: a preamplifier converting the current signal to voltage and supplying the resultant voltage signal; a main amplifier amplifying the voltage signal supplied from the preamplifier, wherein at least an input stage of the main amplifier is made up from a differential circuit; first and second emitter-follower circuits; a first resistor provided between the transistor in the first emitter follower circuit and the output of the first emitter-follower circuit; a second resistor provided between the transistor in the second emitter-follower circuit and the output of the second emitter-follower circuit and having the same resistance as the first resistor; and a capacitor inserted between one end of the second resistor and a ground node. The input of the first emitter-follower circuit and the input of the second emitter-follower circuit are connected in common, and the output of the preamplifier is supplied to this common connection node. The outputs of the first and second emitter-follower circuits are each connected to a respective input of a pair of inputs of the differential circuit. A low-pass filter detecting the average potential of the voltage signal is formed by the capacitor and the second resistor.

Of amplification circuits using transistors as active elements, follower circuits such as emitter-follower circuits and source-follower circuits typically have higher input impedance and a broader frequency band than differential amplification circuits. Here, providing two or more follower circuits in parallel between the preamplifier and main amplifier in a signal amplifier that is provided in an optical receiver circuit and connecting a level-adjustment resistor to one follower circuit and an LPF to the other follower circuit can prevent the narrowing of bandwidth and the reduction of sensitivity when the level-adjustment resistor is connected. In this way, a wideband frequency characteristic and high optical receiver sensitivity characteristic can be obtained even when the signal amplifier for an optical receiver circuit is constructed by using active elements having low input impedance such as bipolar transistors.

DESCRIPTION OF EMBODIMENTS

First Exemplary Embodiment

Figure 4:
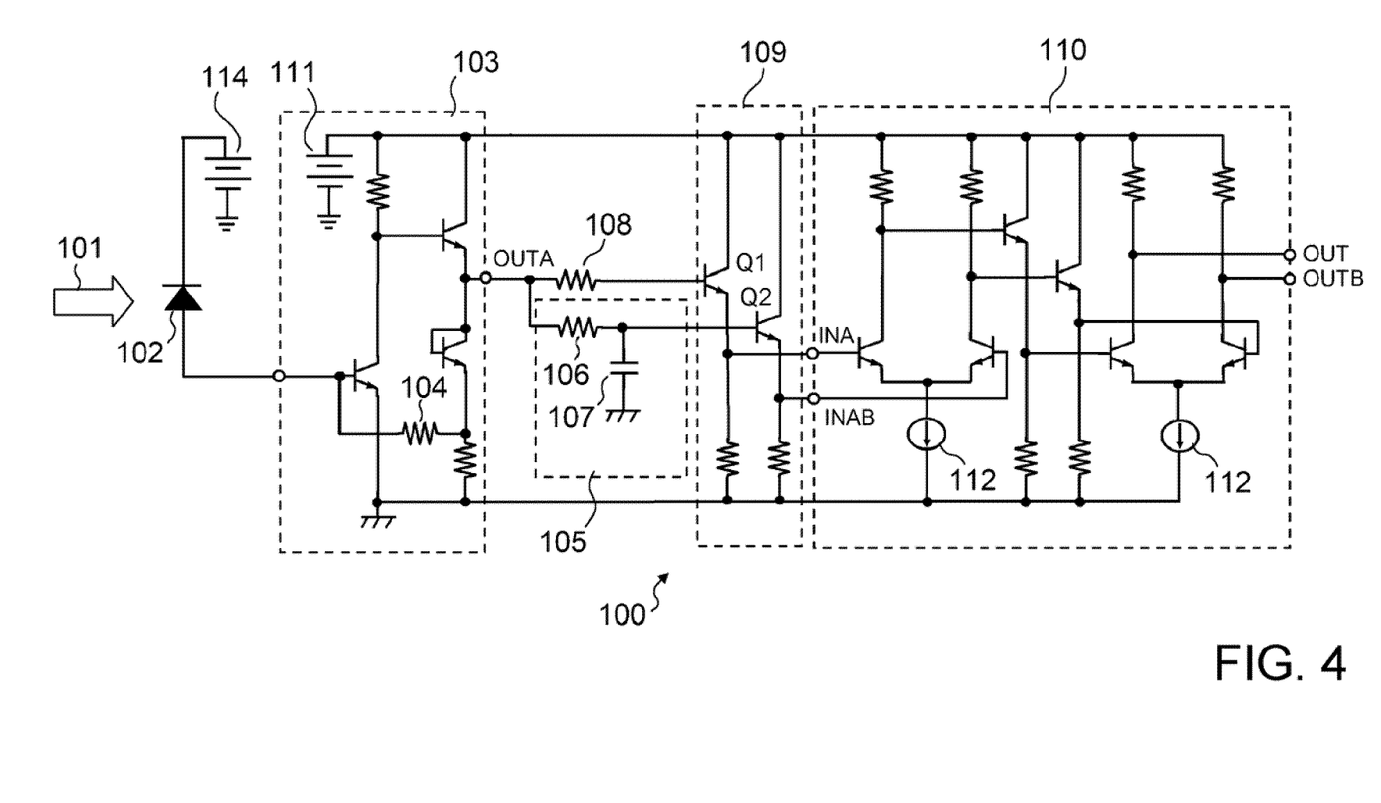
FIG. 4 is a circuit diagram showing the configuration of an optical receiver circuit according to a first exemplary embodiment of the present invention.

Optical receiver circuit 100 of the first exemplary embodiment shown in FIG. 4 includes: photodetector 102 that converts optical signal 101 emitted from, for example, an optical fiber to a current signal; preamplifier 103 that is connected to the output of photodetector 102 and made up from a transimpedance amplifier including feedback resistor 104; low-pass filter (LPF) 105 made up from resistor 106 in which the resistance is R and capacitor 107 in which the capacitance is C; and main amplifier 110 made up by two stages of differential amplification circuits in cascade connection. LPF 105 passes and supplies the low-frequency component of the output signal of preamplifier 103 as a low-frequency signal. In this optical receiver circuit 100, emitter-follower unit 109, to be described later, is provided between preamplifier 103 and main amplifier 110, and LPF 105 is formed in the stage preceding this emitter-follower unit 109. The signal amplifier connected to photodetector 102 is made up by each of the circuits from preamplifier 103 up to main amplifier 110. Preamplifier 103, emitter-follower unit 109, and main amplifier 110 all use bipolar transistors as basic transistors. In addition, power supply 111 is provided in common for preamplifier 103, emitter-follower unit 109, and main amplifier 110, and a power-supply voltage of, for example, +5 V is supplied to these circuits. In this configuration, preamplifier 103, emitter-follower unit 109, and main amplifier 110 are formed on the same semiconductor substrate as a semiconductor integrated circuit.

Photodetector 102 receives optical signal 401, converts optical signal 401 to a current signal, and supplies the resulting current signal as output, and is made up by, for example, a semiconductor photodetector such as a photodiode. In this exemplary embodiment in particular, an InGaAs-type PIN photodiode or an avalanche photodiode (APD) is preferably used as photodetector 102. An 1.3 μm-band, 1.55 μm-band or the like can be selected as the light reception wavelength band of photodetector 102 by adjusting the composition of each element in InGaAs.

Preamplifier 103 not only includes an amplification stage composed of one bipolar transistor and an output stage in which two bipolar transistors are connected in a series, but is also provided with feedback resistor 104 in which the resistance is, for example, 400Ω, and, as previously stated, is configured as a transimpedance amplifier. The value of feedback resistor 104 is selected as appropriate according to the current-voltage conversion efficiency or frequency characteristic. The anode of photodetector 102 is connected to the gate of the bipolar transistor of the amplification stage, and a reverse voltage is applied to the cathode of photodetector 102 from power supply 114 for the photodetector. In preamplifier 103, the current signal from photodetector 102 flows to feedback resistor 104, whereby a difference in potential occurs over the two ends of feedback resistor 104, and the output potential of preamplifier 103 changes in correspondence with this difference.

The configurations of preamplifier 103 and main amplifier 110 are similar to those of preamplifier 423 and main amplifier 430, respectively, in optical receiver circuit 420 of the related art shown in FIG. 2 in which bipolar transistors are used as basic transistors.

Emitter-follower unit 109 is provided with two emitter-follower circuits, i.e., first emitter-follower circuit that including transistor Q1 and second emitter-follower circuit including transistor Q2. Output OUTA of preamplifier 103 is connected by way of level-adjustment resistor 108 to the input of the first emitter-follower circuit, i.e., the base of transistor Q1; and the output of the first emitter-follower circuit is directly connected to non-inverted input terminal INA of main amplifier 110. In addition, output OUTA of preamplifier 103 is connected by way of LPF 105 made up by resistor 106 and capacitor 107 to the input of the second emitter-follower circuit, i.e., the base of transistor Q2; and the output of the second emitter-follower circuit is connected directly to inverted input terminal INAB of main amplifier 110. The resistance of level-adjustment resistor 108 is equal to resistance R of resistor 106 of LPF 105, and resistance R is typically 50Ω. Capacitor 107 can in some cases be configured in the semiconductor integrated circuit making up this optical receiver circuit, but in the example shown here, capacitor 107 is made up from a chip capacitor provided outside the semiconductor integrated circuit and has capacitance C of 0.11 μF. Thus, in LPF 105, not only is resistor 106 provided between the output OUTA of preamplifier 103 and the second emitter-follower circuit, but further, one end of capacitor 107 is connected to the connection node of resistor 103 and the emitter-follower circuit and the other end of the capacitor is grounded. The cut-off frequency $f_c$ of LPF 105 is given by $$f_c = \frac{1}{2\pi RC},$$

and is equal to approximately 30 kHz based on the above-described values of R and C. A low-pass filtered signal that is of a lower frequency than this cut-off frequency $f_c$ is supplied from LPF 105, and this low-pass filtered signal gives the instantaneous average value of the main signal supplied from preamplifier 103 and is applied as input to inverted input terminal INAB of main amplifier 110 by way of the second emitter-follower circuit. In contrast, a frequency component of frequencies that are higher than, cut-off frequency $f_c$ is blocked by LPF 105 and is not applied as input to inverted input terminal INAB of main amplifier 110.

Main amplifier 110 made up from a two-stage differential amplification circuit is provided with constant-current source circuit 112 for each differential amplification stage. A signal that has undergone current-voltage conversion by preamplifier 103 is applied as the main signal to non-inverted input terminal INA of the first-stage differential amplification circuit by way of level-adjustment resistor 108 and the first emitter-follower circuit. In contrast, the instantaneous average value of the main signal to non-inverted input terminal INA is given by the action of LPF 105 to inverted input terminal INAB of the first-stage differential amplification circuit. As a result, complementary outputs having equal amplitude and the same DC level are obtained at the pair of outputs OUT, OUTB of main amplifier 110, as in the case of the optical receiver circuit shown in FIG. 1.

Figure 5:
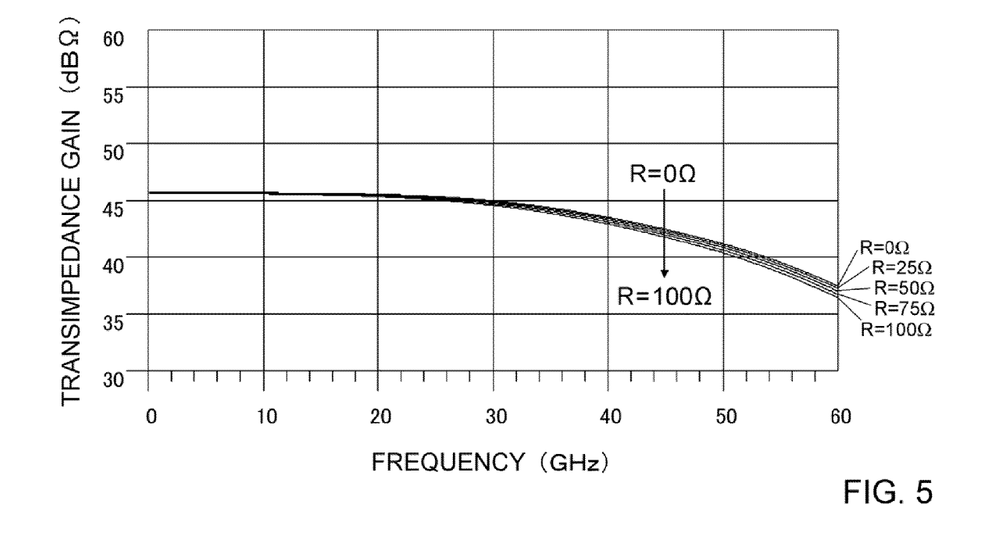
FIG. 5 is a graph showing a frequency characteristic of transimpedance gain of a signal amplifier in the optical receiver circuit shown in FIG. 4.

FIG. 5 shows the frequency characteristic of the transimpedance gain for the signal amplifier as a whole when the value of level-adjustment resistor 108 of the signal amplifier is changed in optical receiver circuit 100 shown in FIG. 4. It can be seen that even when the resistance of level-adjustment resistor 108 is increased from 0Ω to 100Ω, the bandwidth and frequency characteristic undergo almost no change. This result is realized because an emitter-follower circuit tends to have a broader bandwidth and is less susceptible to the influence of a drop in bandwidth caused by an input resistor than a differential amplification circuit. By thus providing emitter-follower unit 109 and providing level-adjustment resistor 108 on the input side of the first emitter-follower circuit, the bandwidth characteristics of the signal amplifier as a whole that is provided in optical receiver circuit 100 can be improved.

In particular, when capacitance C of capacitor 107 in LPF 105 must be decreased, resistance R of resistor 106 must be increased proportionally, resulting in an increase in the value of level-adjustment resistor 108. According to the present exemplary embodiment, a sufficient bandwidth characteristic and frequency characteristic can be obtained in the signal amplifier for the optical receiver circuit even when the resistance of level-adjustment resistor 108 is high.

Second Exemplary Embodiment

Figure 6:
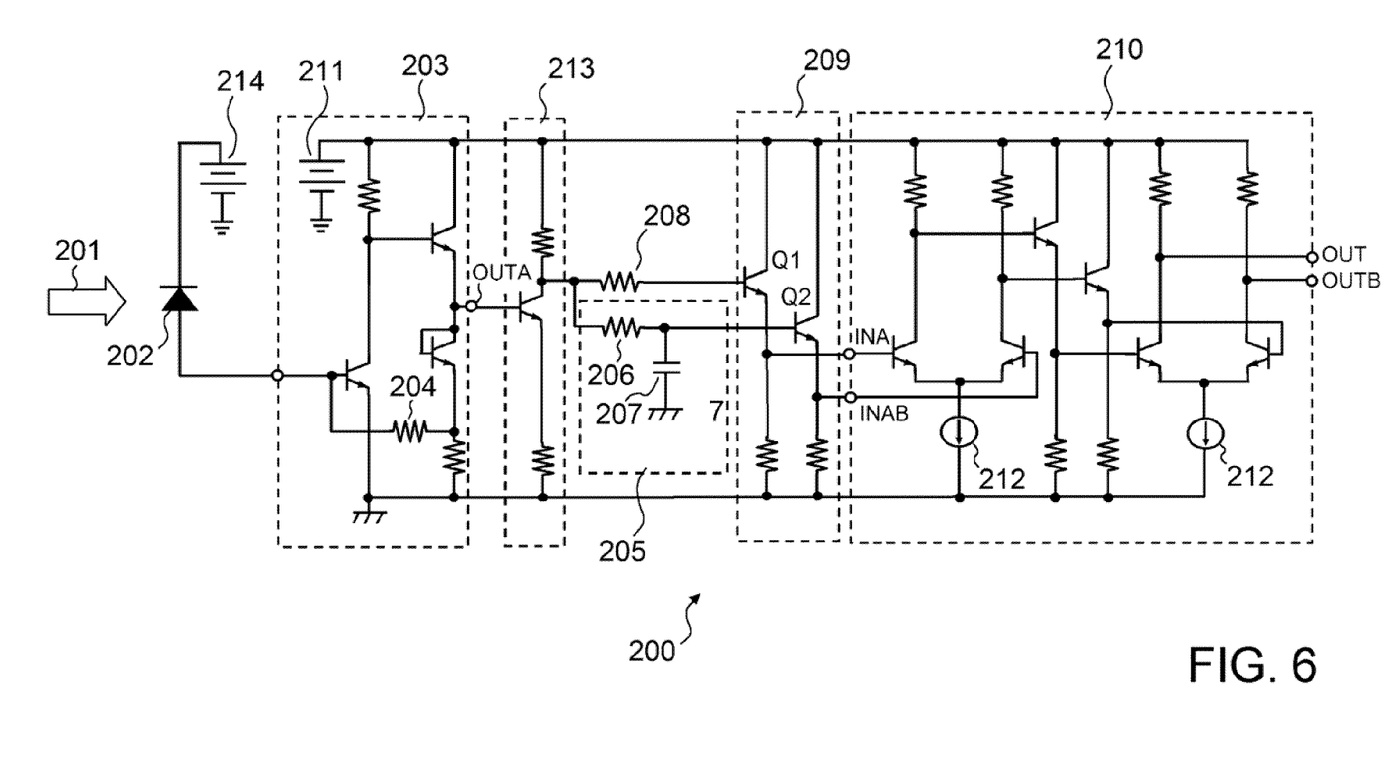
FIG. 6 is a circuit diagram showing the configuration of an optical receiver circuit according to a second exemplary embodiment of the present invention.

Optical receiver circuit 200 of the second exemplary embodiment shown in FIG. 6 is similar to the optical receiver circuit shown in FIG. 4, and includes: photodetector 202 which converts optical signal 201 emitted from an optical fiber to a current signal; preamplifier 203 that is connected to the output of photodetector 202 and constituted by a transimpedance amplifier including feedback resistor 204; LPF made up from resistor 206 having resistance R and capacitor 207 having capacitance C; main amplifier 210 made up by two stages of differential amplification circuits in cascade connection; and emitter-follower unit 209 that is provided between preamplifier 203 and main amplifier 210 and that includes two emitter-follower circuits. Preamplifier 203, emitter-follower unit 209, and main amplifier 210 are all of configurations that use bipolar transistors as basic circuits.

The points of difference of optical receiver circuit 200 shown in FIG. 6 from the optical receiver circuit shown in FIG. 4 are the provision of level-up circuit 213 between output OUTA of preamplifier 203 and the commonly connected input of first and second emitter-follower circuits in emitter-follower unit 209. Level-up circuit 213 is configured as a circuit that uses a bipolar transistor as a basic transistor. Preamplifier 203 is similar to preamplifier 103 in the optical receiver circuit shown in FIG. 4 and is configured as a transimpedance amplifier provided with feedback resistor 204 having a resistance of 500Ω. The signal amplifier connected to photodetector 202 is made up by each of the circuits from preamplifier 203 up to main amplifier 210. Here, preamplifier 203, emitter-follower unit 209, main amplifier 210, and level-up circuit 213 are integrated on the same semiconductor substrate. In addition, power supply 211 having a voltage of, for example, +3.3 V is provided in common for preamplifier 203, emitter-follower unit 209, main amplifier 210, and level-up circuit 213.

In this optical receiver circuit 200 as well, power supply 214 is provided for applying a reverse voltage to photodetector 202. LPF 205 and emitter-follower unit 209 are each of the same configurations as LPF 105 and emitter-follower unit 109, respectively, in the optical receiver circuit shown in FIG. 4.

Output OUTA of preamplifier 203 is directly connected to level-up circuit 213. The output of level-up circuit 213 is connected to the input of the first emitter-follower circuit by way of level-adjustment resistor 208, and the output of first emitter-follower circuit 209 is directly connected to non-inverted input terminal INA of main amplifier 210. The output of level-up circuit 213 is connected to the input of the second emitter-follower circuit by way of LPF 205 that is made up by resistor 206 and capacitor 207; and the output of the second emitter-follower circuit is connected to inverted input terminal INAB of main amplifier 210. In this exemplary embodiment, the resistance of level-adjustment resistor 208 and the resistance of resistor 206 of LPF 205 are the same resistance R of 100Ω. Capacitor 207 can in some cases be configured in the semiconductor integrated circuit making up optical receiver circuit 200, but in the example shown here, is constituted by a chip capacitor provided outside the semiconductor integrated circuit with a capacitance C of 0.11 μF.

The cut-off frequency $f_c$ of LPF 205 is given by $$f_c = \frac{1}{2\pi RC},$$

and is approximately 15 kHz based on the values of R and C described hereinabove. A low-pass filtered signal of a frequency lower than this cut-off frequency $f_c$ is supplied from LPF 205, and this low-pass filtered signal gives the instantaneous average value of the signal supplied from preamplifier 203 and is applied as input to inverted input terminal INAB of main amplifier 210 by way of the second emitter-follower circuit. In contrast, the signal component of frequencies higher than cut-off frequency $f_c$ is blocked by LPF 205 and is not applied as input to inverted input terminal INAB of main amplifier 210.

Main amplifier 210 is of the same configuration as main amplifier 110 in the optical receiver circuit shown in FIG. 4, is made up by the two stages of differential amplification circuits as previously described, and is provided with constant-current source circuit 212 for each differential amplification circuit. A signal that has undergone current-voltage conversion by preamplifier 203 is applied as input to non-inverted input terminal INA of the first-stage differential amplification circuit by way of level-adjustment resistor 208 and the first emitter-follower circuit. In contrast, the instantaneous average value of the signal applied to non-inverted input terminal INA is given by the action of LPF 205 at inverted input terminal INAB of the first-stage differential amplification circuit. As a result, complementary outputs in which the amplitude is equal and the DC levels are the same are obtained at the pair of outputs OUT, OUTB of main amplifier 210, as in the case of the signal amplifier for an optical receiver circuit shown in FIG. 4.

In optical receiver circuit 200 shown in FIG. 6, the provision of level-up circuit 213 between preamplifier 203 and emitter-follower unit 209 enables compensation of the fall in the level of the main signal or the instantaneous average value in the emitter-follower circuits, whereby the main signal or instantaneous average value of an appropriate level is applied as input to each of inputs INA, INAB of main amplifier 210. For example, level-up circuit 213 becomes necessary when the voltage of power supply 211 of optical receiver circuit 200 is low.

In the second exemplary embodiment as well, the emitter-follower circuits have a broader bandwidth than the differential amplification circuits and are less susceptible to the influence of band drops due to the input resistance, and providing level-adjustment resistor 208 in the input of first emitter-follower circuit can therefore realize an improvement of the bandwidth characteristics of the signal amplifier as a whole that is provided in optical receiver circuit 200.

Third Exemplary Embodiment

Figure 7:
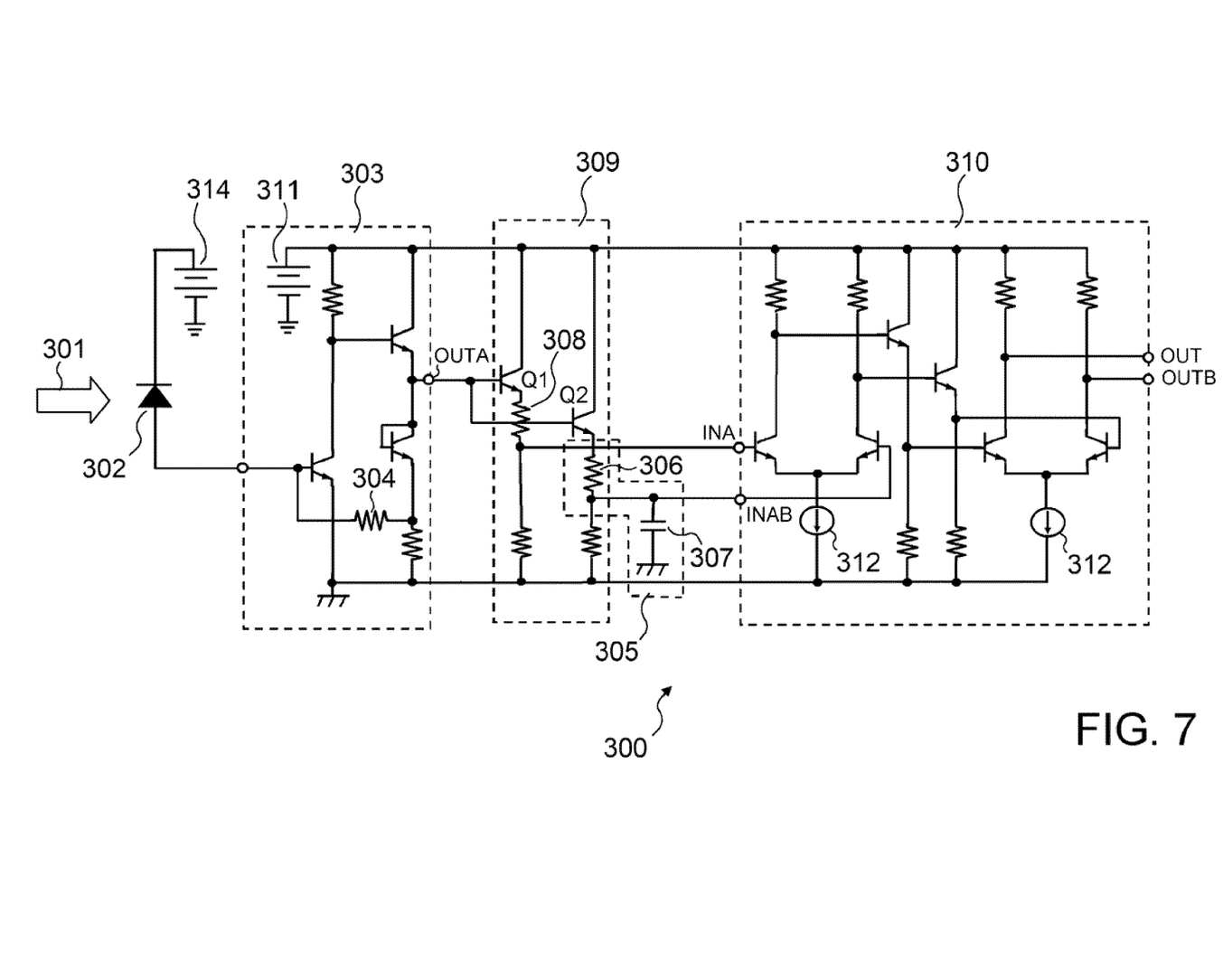
FIG. 7 is a circuit diagram showing the configuration of an optical receiver circuit according to a third exemplary embodiment of the present invention.

Optical receiver circuit 300 of the third exemplary embodiment shown in FIG. 7 includes: photodetector 302 which converts optical signal 301 emitted from an optical fiber to a current signal; preamplifier 303 connected to the output of photodetector 302; LPF 305 including resistor 306 and capacitor 307; main amplifier 310 that is made up from two stages of differential amplification circuits connected in cascade connection; and emitter-follower unit 309 provided between preamplifier 303 and main amplifier 310. The signal amplifier connected to photodetector 302 is made up by each of the circuits from preamplifier 303 up to main amplifier 310. Preamplifier 303, emitter-follower unit 309, and main amplifier 310 all use bipolar transistors as basic transistors and are formed by being integrated on the same semiconductor substrate. In this optical receiver circuit 300 as well, power supply 314 is provide for applying a reverse voltage to photodetector 302. In addition, power supply 311 in which the power-supply voltage is, for example, +5 V is provided in common to preamplifier 303, emitter-follower unit 309, and main amplifier 310.

Preamplifier 303 is of the same configuration as preamplifier 103 in the optical receiver circuit shown in FIG. 4 and not only includes an amplification stage composed of one bipolar transistor and an output stage in which two bipolar transistors are connected in a series but is also provided with feedback resistor 304 in which the resistance is 400Ω. Preamplifier 303 is thus configured as a transimpedance amplifier.

Emitter-follower unit 309 is provided with two emitter-follower circuits, i.e., a first emitter-follower circuit having transistor Q1 and a second emitter-follower circuit having transistor Q2. The inputs of the first and second emitter-follower circuits are connected in common and connected to output OUTA of preamplifier 303. In the first emitter-follower circuit, level-adjustment resistor 308 is inserted between the output of the first emitter-follower circuit and the emitter of transistor Q1, and the output of the first emitter-follower circuit is connected to non-inverted input terminal INA of main amplifier 310. In the second emitter-follower circuit, resistor 306 of LPF 305 is inserted between the output of the second emitter-follower circuit and the emitter of transistor Q2, and the output of the second emitter-follower circuit is connected to inverted input terminal INAB of main amplifier 310. The capacitor of LPF 305 is provided between a ground node and the main amplifier 310-side end of resistor 306, i.e., the output of the second emitter-follower circuit. The resistance of level-adjustment resistor 308 and the resistance of resistor 306 of LPF 305 are equal, this resistance being resistance R of 500Ω. Capacitor 307 can in some cases be formed inside the semiconductor integrated circuit making up this optical receiver circuit, but in this example, is constituted by a chip capacitor provided outside the semiconductor integrated circuit with a capacitance C of 0.11 μF.

The cut-off frequency $f_c$ of this LPF 305 is given by $$f_c = \frac{1}{2\pi RC},$$

and is approximately 30 kHz based on the above-described values of R and C. A low-pass filtered signal of a frequency lower than this cut-off frequency $f_c$ is supplied from LPF 305, and this low-pass filtered signal gives the instantaneous average value of the main signal supplied from preamplifier 303 and is applied as input to inverted input terminal INAB of main amplifier 310 by way of the second emitter-follower circuit. In contrast, the signal component of frequencies that are higher than cut-off frequency $f_c$ is blocked by LPF 305 and is not applied as input to inverted input terminal INAB of main amplifier 310.

Main amplifier 310 made up by two stages of differential amplification circuits is of the same configuration as main amplifier 110 in the optical receiver circuit shown in FIG. 4 and is provided with constant-current source circuit 312 for each differential amplification circuit. A signal that has undergone current-voltage conversion by preamplifier 303 is applied as the main signal to non-inverted input terminal INA of the first-stage differential amplification circuit by way of level-adjustment resistor 308 and the first emitter-follower circuit. In contrast, the instantaneous average value of the main signal to non-inverted input terminal INA is given by the action of LPF 305 to inverted input terminal INAB of the first-stage differential amplification circuit. As a result, complementary outputs in which the amplitudes are equal and the DC levels are the same are obtained at the pair of outputs OUT, OUTB of main amplifier 310, as in the signal amplifiers for the optical receiver circuits of the first and second exemplary embodiments.

In the third exemplary embodiment as well, the emitter-follower circuits have a broader bandwidth than the differential amplification circuits and are less susceptible to the influence of band drops caused by input resistance, and providing level-adjustment resistor 308 in the first emitter-follower circuit therefore enables the realization of an improvement in bandwidth characteristics of the signal amplifier as a whole that is provided in optical receiver circuit 300.

Although level-adjustment resistor 308 and resistor 306 of LPF 307 were inserted into the first and second emitter-follower circuits, respectively, in emitter-follower unit 309 in the preceding explanation, the form of connecting the level-adjustment resistor and the resistor of the LPF to the emitter-follower circuits in the third exemplary embodiment is not limited to the form described hereinabove. In addition in the third exemplary embodiment, as in the case of the second exemplary embodiment, a level-up circuit may also be inserted between output OUTA of preamplifier 303 and the inputs connected in common of the first and second emitter-follower circuits. In this case, the level-up circuit may use a bipolar transistor as the basic transistor and may be formed by integrating on the same semiconductor substrate together with preamplifier 303, emitter-follower unit 309, and main amplifier 310.

Fourth Exemplary Embodiment

In the first to third exemplary embodiments described hereinabove, examples were described in which the signal amplifier for an optical receiver circuit was configured using bipolar transistors as basic transistors as a semiconductor integrated circuit. However, the present invention is not limited to this form. For example, in a signal amplifier for an optical receiver circuit that uses other devices such as junction-type FETs or MOS (Metal-Oxide-Semiconductor) FETs as active elements, configurations similar to those described above are possible. When FETs are used as active elements, source-follower circuits are preferably employed in place of the above-described emitter-follower circuits.

Figure 8:
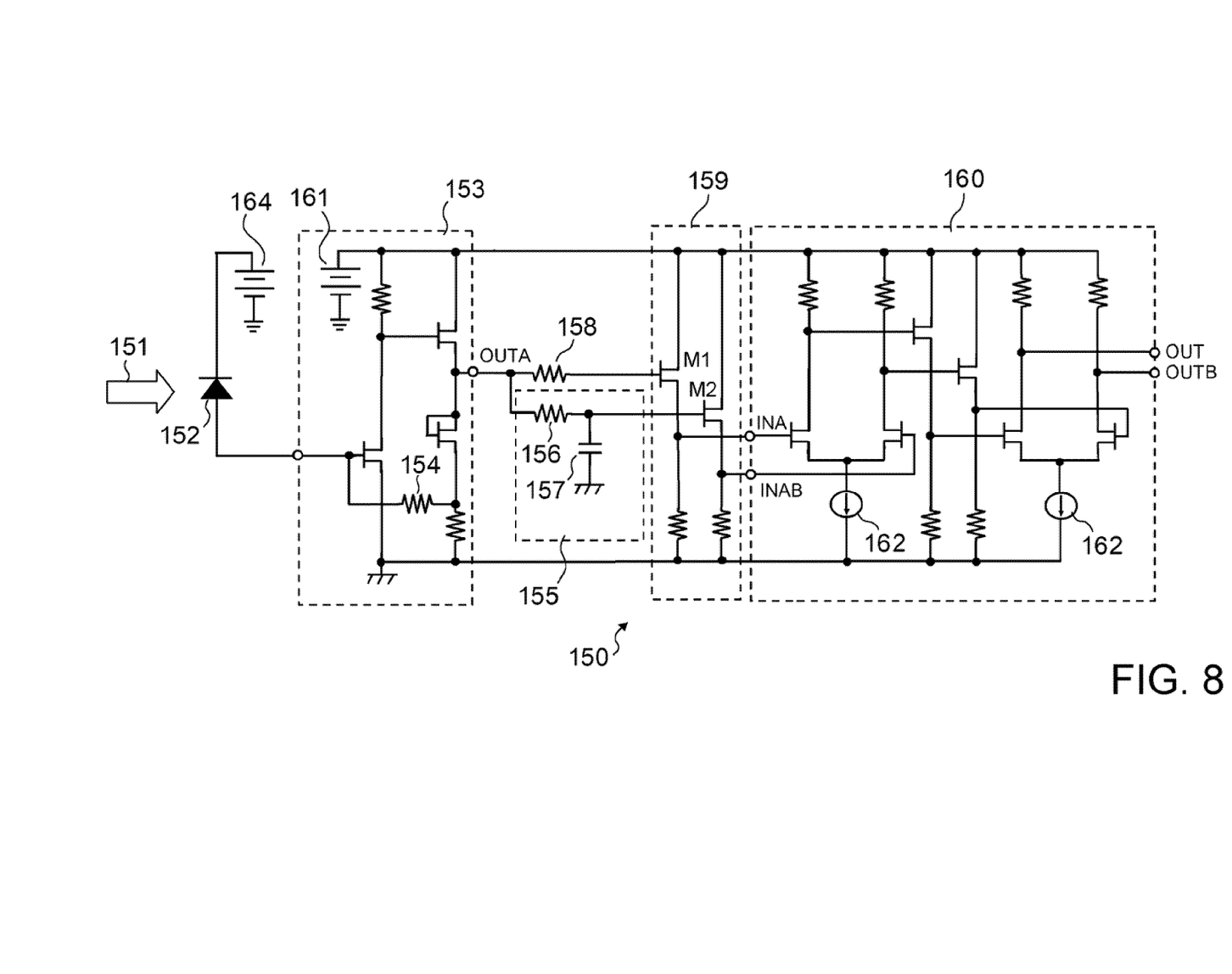
FIG. 8 is a circuit diagram showing the configuration of an optical receiver circuit according to a fourth exemplary embodiment of the present invention.

Optical receiver circuit 150 of the fourth exemplary embodiment shown in FIG. 8 uses FETs in place of bipolar transistors as the basic transistors in the optical receiver circuit shown in FIG. 1. In other words, the optical receiver circuit shown in FIG. 8 is provided with: photodetector 152 which converts optical signal 151 to a current signal; preamplifier 153 that is connected to the output of photodetector 152 and that is configured as a transimpedance amplifier including feedback resistor 154; LPF 155 made up by resistor 156 having resistance R and capacitor 157 having capacitance C; main amplifier 160 made up by two stages of differential amplification circuits in cascade connection; and source-follower unit 159 provided between preamplifier 153 and main amplifier 160. The signal amplifier connected to photodetector 152 is made up by each of the circuits from preamplifier 153 up to main amplifier 160. Power supply 161 is provided common to preamplifier 153, source-follower unit 159, and main amplifier 160, and in addition, power supply 164 is provided for applying a reverse voltage to photodetector 152.

Preamplifier 153 is of a configuration in which the bipolar transistors in preamplifier 103 of the optical receiver circuit shown in FIG. 4 are all replaced by FETs. Main amplifier 160 is of a configuration in which the bipolar transistors in main amplifier 110 of the optical receiver circuit shown in FIG. 4 are all replaced by FETs, and constant-current source circuit 162 is provided for each differential amplification circuit.

Source-follower unit 159 is provided with two source-follower circuits, i.e., a first source-follower circuit including transistor M1 and a second source-follower circuit including transistor M2. Output OUTA of preamplifier 153 is connected by way of level-adjustment resistor 158 to the input of the first source-follower circuit, i.e., the gate of transistor M1; and the output of the first source-follower circuit is directly connected to non-inverted input terminal INA of main amplifier 160. In addition, output OUTA of preamplifier 153 is connected by way of LPF 155 made up by resistor 156 and capacitor 157 to the input of the second source-follower circuit, i.e., to the gate of transistor M2; and the output of the second source-follower circuit is directly connected to inverted input terminal INAB of main amplifier 160. The resistance of level-adjustment resistor 158 is assumed to be equal to resistance R of resistor 156 of LPF 155.

Optical receiver circuit 150 of the fourth exemplary embodiment operates similarly to optical receiver circuit 100 of the first exemplary embodiment. In the fourth embodiment as well, source-follower circuits have a broader bandwidth than differential amplification circuits and are less susceptible to the influence of band drops caused by input resistance, and as a result, providing level-adjustment resistor 158 in the input of the first source-follower circuit enables an improvement in bandwidth characteristics of the signal amplifier as a whole that is provided in optical receiver circuit 150.

In another exemplary embodiment of the present invention, a level-up circuit is provided between the output of the preamplifier and the common connection node in the optical receiver circuit of each of the exemplary embodiments of the present invention.

Although the present invention has been described hereinabove with reference to exemplary embodiments and examples, the present invention is not limited to the above-described exemplary embodiments and examples. The configuration and details of the present invention is open to various modifications within the scope of the present invention that will be readily understood by one of ordinary skill in the art.

REFERENCE SIGNS LIST 100, 150, 200, 300, 400, 420 optical receiver circuit;
101, 151, 201, 301, 401 light;
102, 152, 202, 302, 402 photodetector;
103, 153, 203, 303, 403, 423 preamplifier;
104, 154, 204, 304, 404 feedback resistor;
105, 155, 205, 305, 405 low-pass filter (LPF);
106, 156, 206, 306, 406 resistor;

107, 157, 207, 307, 407 capacitor;
108, 158, 208, 308, 408 level-adjustment resistor;
109, 209, 309 emitter-follower unit;
110, 160, 210, 310, 410, 430 main amplifier;
111, 114, 154, 161, 211, 214, 311, 314, 411, 414 power supply;
112, 162, 212, 312, 412 constant-current source circuit;
159 source-follower unit; and
213 level-up circuit.

CITATION LIST

Patent Literature 1: JP-A-2000-031914
Patent Literature 2: JP-A-2000-269590
Patent Literature 3: JP-A-2003-051723
Patent Literature 4: JP-A-H9-205331
Patent Literature 5: JP-A-H9-233030

The invention claimed is:

1. A signal amplifier connected to a photodetector that converts a received optical signal to a current signal, said signal amplifier comprising:
a preamplifier converting said current signal to voltage and supplying a resultant voltage signal;
a main amplifier amplifying the voltage signal supplied from said preamplifier, wherein at least an input stage of said main amplifier is made up from a differential circuit;
two or more follower circuits provided between said preamplifier and said main amplifier and supplied with said voltage signal;
resistors having equal resistance provided for each follower circuit on paths between an output of said preamplifier and each input of said main amplifier, and
a capacitor having one end connected to one of said resistors and the other end grounded;
wherein a low-pass filter detecting an average potential of said voltage signal is formed by said capacitor and the resistor connected to said capacitor.

2. The signal amplifier according to claim 1, wherein said follower circuits comprise emitter follower circuits or source-follower circuits.

3. The signal amplifier according to claim 1, wherein a bipolar transistor is used as an active element.

4. The signal amplifier according to claim 1, wherein said input stage of said main amplifier is formed by using a bipolar transistor.

5. The signal amplifier according to claim 1, wherein said preamplifier is configured as a transimpedance amplifier.

6. A signal amplifier connected to a photodetector that converts a received optical signal to a current signal, said signal amplifier comprising:
a preamplifier converting said current signal to voltage and supplying a resultant voltage signal;
a main amplifier amplifying the voltage signal supplied from said preamplifier, wherein at least an input stage of said main amplifier is made up from a differential circuit;
first and second emitter-follower circuits;
a first resistor having one end connected to an input of said first emitter-follower circuit;
a second resistor having one end connected to an input of said second emitter-follower circuit and having the same resistance as said first resistor; and
a capacitor inserted between said one end of said second resistor and a ground node;
wherein:
the other end of said first resistor and the other end of said second resistor are connected in common, and an output of said preamplifier is supplied to this common connection node;
outputs of said first and second emitter-follower circuits are each connected to a respective input of a pair of inputs of said differential circuit; and
a low-pass filter detecting an average potential of said voltage signal is formed by said capacitor and said second resistor.

7. The signal amplifier according to claim 6, further comprising a level-up circuit between the output of said preamplifier and said common connection node.

8. The signal amplifier according to claim 6, wherein a bipolar transistor is used as an active element.

9. The signal amplifier according to claim 6, wherein said input stage of said main amplifier is configured using a bipolar transistor.

10. The signal amplifier according to claim 6, wherein said preamplifier is configured as a transimpedance amplifier.

11. The signal amplifier according to claim 6, wherein said main amplifier, said preamplifier, and each of said emitter follower circuits are integrated on the same semiconductor substrate.

12. The signal amplifier according to claim 7, wherein said main amplifier, said preamplifier, each of said emitter follower circuits, and said level-up circuit are integrated on the same semiconductor substrate.

13. A signal amplifier connected to a photodetector that converts a received optical signal to a current signal, said signal amplifier comprising:
a preamplifier converting said current signal to voltage and supplying a resultant voltage signal;
a main amplifier amplifying the voltage signal supplied from said preamplifier, wherein at least an input stage of said main amplifier is made up from a differential circuit;
first and second emitter-follower circuits;
a first resistor provided between a transistor in said first emitter follower circuit and an output of said first emitter-follower circuit;
a second resistor provided between a transistor in said second emitter-follower circuit and an output of said second emitter-follower circuit and having the same resistance as said first resistor; and
a capacitor inserted between one end of said second resistor and a ground node;
wherein:
an input of said first emitter-follower circuit and an input of said second emitter-follower circuit are connected in common, and an output of said preamplifier is supplied to this common connection node;
the outputs of said first and second emitter-follower circuits are each connected to a respective input of a pair of inputs of said differential circuit; and
a low-pass filter detecting an average potential of said voltage signal is formed by said capacitor and said second resistor.

14. The signal amplifier according to claim 13, further comprising a level-up circuit between the output of said preamplifier and said common connection node.

15. The signal amplifier according to claim 13, wherein a bipolar transistor is used as an active element.

16. The signal amplifier according to claim 13, wherein said input stage of said preamplifier is configured using a bipolar transistor.

17. The signal amplifier according to claim 13, wherein said preamplifier is configured as a transimpedance amplifier.

18. The signal amplifier according to claim 13, wherein said main amplifier, said preamplifier, and each of said emitter follower circuits are integrated on the same semiconductor substrate.

19. The signal amplifier according to claim 14, wherein said main amplifier, said preamplifier, each of said emitter follower circuits, and said level-up circuit are integrated on the same semiconductor substrate.

* * * * *